(12) United States Patent
Singh et al.

(10) Patent No.: US 6,479,820 B1
(45) Date of Patent: Nov. 12, 2002

(54) ELECTROSTATIC CHARGE REDUCTION OF PHOTORESIST PATTERN ON DEVELOPMENT TRACK

(75) Inventors: Bhanwar Singh, Morgan Hill, CA (US); Ramkumar Subramanian, San Jose, CA (US); Bharath Rangarajan, Santa Clara, CA (US); Khoi A. Phan, San Jose, CA (US); Bryan K. Choo, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/557,720

(22) Filed: Apr. 25, 2000

(51) Int. Cl.$^7$ ................................................. G03F 7/30
(52) U.S. Cl. ..................... 250/310; 396/578; 430/326; 430/328; 430/324; 430/296; 430/330; 430/331
(58) Field of Search ......................... 250/310; 396/578; 430/296, 331, 324, 326, 328, 330

(56) References Cited

U.S. PATENT DOCUMENTS

| | | | |
|---|---|---|---|
| 4,312,935 A | 1/1982 | Engler et al. ................ 430/296 |
| 4,610,953 A | 9/1986 | Hashimoto et al. .......... 430/331 |
| 5,019,485 A | * 5/1991 | Nakamura et al. ........ 430/271.1 |
| 5,144,833 A | 9/1992 | Amer et al. .................. 73/105 |
| 5,178,989 A | * 1/1993 | Heller et al. .................. 216/48 |
| 5,701,013 A | 12/1997 | Hsia et al. ................ 250/491.1 |
| 5,702,566 A | 12/1997 | Tsui ......................... 156/643.1 |
| 5,858,879 A | 1/1999 | Chao et al. .................. 438/725 |

* cited by examiner

Primary Examiner—John R. Lee
Assistant Examiner—Zia R. Hashmi
(74) Attorney, Agent, or Firm—Amin & Turocy, LLP

(57) ABSTRACT

In one embodiment, the present invention relates to a method of processing a photoresist on a semiconductor structure, involving the steps of exposing and developing the photoresist; evaluating the exposed and developed photoresist to determine if negative charges exist thereon; contacting the exposed and developed photoresist with a positive ion carrier thereby reducing any negative charges thereon; and evaluating the exposed and developed photoresist with an electron beam. In another embodiment, the present invention relates to a system for processing a patterned photoresist on a semiconductor structure, containing a charge sensor for determining if charges exist on the patterned photoresist and measuring the charges; a means for contacting the patterned photoresist with a positive ion carrier to reduce the charges thereon; a controller for setting at least one of time of contact between the patterned photoresist and the positive ion carrier, temperature of the positive ion carrier, concentration of positive ions in the positive ion carrier, and pressure under which contact between the patterned photoresist and the positive ion carrier occurs; and a device for evaluating the patterned photoresist with an electron beam.

23 Claims, 5 Drawing Sheets

ELECTROSTATIC CHARGE REDUCTION OF PHOTORESIST PATTERN ON DEVELOPMENT TRACK

TECHNICAL FIELD

The present invention generally relates to improved photoresist processing. In particular, the present invention relates to reducing electrostatic charges on developed photoresists using an improved rinsing process.

BACKGROUND ART

Microlithography processes for making miniaturized electronic components, such as in the fabrication of computer chips and integrated circuits, involve using photoresists. Generally, a coating or film of a photoresist is applied to a substrate material, such as a silicon wafer used for making integrated circuits. The substrate may contain any number of layers or devices thereon.

The photoresist coated substrate is baked to evaporate any solvent in the photoresist composition and to fix the photoresist coating onto the substrate. The baked coated surface of the substrate is next subjected to selective radiation; that is, an image-wise exposure to radiation. This radiation exposure causes a chemical transformation in the exposed areas of the photoresist coated surface. Types of radiation commonly used in microlithographic processes include visible light, ultraviolet (UV) light and electron beam radiant energy. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist. Many developer solutions contain water and a base, such as water and a hydroxide compound.

Treating a selectively exposed photoresist with a developer conventionally involves depositing the liquid developer solution over the photoresist clad substrate and spinning the substrate whereby the liquid developer solution and dissolved areas of the photoresist are removed from the substrate by centrifugal forces. A rinsing solution, typically water, is then deposited over the photoresist clad substrate and the substrate is spun again to remove the water and any debris solubilized by the water. Spinning the substrate is a convenient and inexpensive method of removing materials from substrate. However, electrostatic charges build up on the developed photoresist during the development and water rinse cycles. Negative charges are particularly encountered on developed photoresists. While the causes of this phenomenon are not completely understood, it is believed that static charges and/or residual base (from the developer) contribute to charge accumulation. Charge accumulation on developed photoresists can be as high as 300–400 volts, and it is typically negative.

Negative charge accumulation on a developed photoresist presents a number of problems. One notable problem is that width measurement of various resist features, such as linewidth and profiling, is rendered inaccurate. Especially when using a scanning electron microscope (SEM) or an atomic force microscope (AFM), it is difficult to obtain accurate data. This is because SEMs and AFMs use an electron beam for generating images (both in projection and detection). The electron beam from the SEM or AFM is repulsed by the negative charge accumulated on the photoresist. The degree of repulsion or deviation from an ideal direction is dependent upon the magnitude of the accumulated negative charge.

This phenomenon is shown in FIG. 1. SEM 10 emits an electron beam (represented by the arrow(s)) towards a developed photoresist structure 12 on semiconductor substrate 14. The developed photoresist structure 12 has an accumulation of negative charge 16 as a result of the lithography process. Due to repulsion between the electron beam and the negative charge 16 of the developed photoresist structure 12, the electron beam path is altered away from the developed photoresist structure 12 without having deflected off or contacting the developed photoresist structure 12. Since the electron beam is not incident on the developed photoresist structure 12, an accurate measure/profile of the structure cannot be obtained. Detection of the altered electron beams provides data indicating at least one of inaccurate linewidth, fuzzy corner definition, and otherwise non-focused images. Assessment of the quality and parameters of a lithography process is consequently difficult or inaccurate and often impossible.

SUMMARY OF THE INVENTION

The present invention provides an improved rinsing process for photolithography. The present invention also provides systems and methods for minimizing charge accumulation on photoresist pattern covered substrates. As a result of the present invention, evaluation of a patterned photoresist, such as linewidth measurement, profile data, corner sharpness, critical dimension determinations, and image inspection, is substantially improved. Subsequent processing of semiconductor substrates after photolithography is accordingly improved.

In one embodiment, the present invention relates to a method of processing a photoresist on a semiconductor structure, involving the steps of exposing and developing the photoresist; evaluating the exposed and developed photoresist to determine if negative charges exist thereon; contacting the exposed and developed photoresist with a positive ion carrier thereby reducing any negative charges thereon; and evaluating the exposed and developed photoresist with an electron beam.

In another embodiment, the present invention relates to a method of reducing electrostatic charges on a developed photoresist to improve evaluation of the photoresist, involving the steps of contacting the developed photoresist with a positive ion carrier thereby reducing the electrostatic charges thereon by at least about 50%, wherein the positive ion carrier comprises an ionized gas, an acid solution, an onium solution, or a positive charge containing film; and evaluating the developed photoresist with one of a scanning electron microscope and an atomic force microscope.

In yet another embodiment, the present invention relates to a method of improving evaluation of a developed photoresist, involving the steps of contacting the developed photoresist with a positive ion carrier thereby reducing any negative charges thereon by at least 75%, the positive ion carrier comprising an ionized gas, an acid solution, a cation containing solution, or a positive charge containing film; and evaluating the developed photoresist with an electron beam, wherein the electron beam is generated from a scanning electron microscope or an atomic force microscope.

In still yet another embodiment, the present invention relates to a system for processing a patterned photoresist on a semiconductor structure, containing a charge sensor for determining if charges exist on the patterned photoresist and measuring the charges; a means for contacting the patterned photoresist with a positive ion carrier to reduce the charges thereon; a controller for setting at least one of time of contact between the patterned photoresist and the positive ion carrier, temperature of the positive ion carrier, concentration of positive ions in the positive ion carrier, and pressure under which contact between the patterned photoresist and the positive ion carrier occurs; and a device for evaluating the patterned photoresist with an electron beam.

In still another embodiment, the present invention relates to a system for reducing electrostatic charges on a developed photoresist to improve evaluation of the photoresist, containing an electrostatic charge sensor for determining if charges exist on the developed photoresist and measuring the charges; a means for contacting the developed photoresist with a positive ion carrier to reduce the charges thereon; a microprocessor-controller, coupled to the electrostatic charge sensor and the means for contacting the developed photoresist with a positive ion carrier, for setting at least one of time of contact between the developed photoresist and the positive ion carrier and concentration of positive ions in the positive ion carrier; and a scanning electron microscope for evaluating the developed photoresist with an electron beam.

DISCLOSURE OF INVENTION

Figure 1:
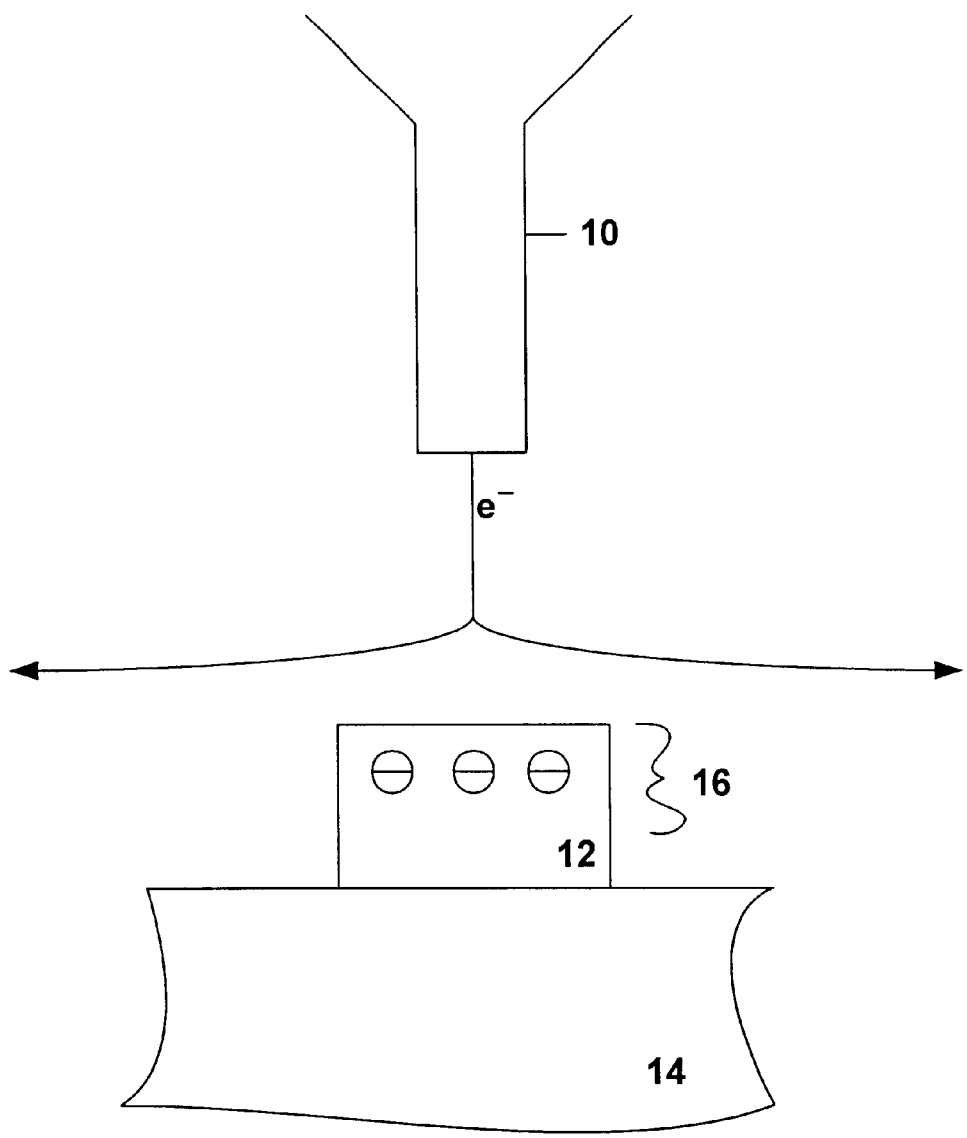
FIG. 1 is a view of a prior art developed photoresist detection scheme using an SEM.

The present invention involves improving the development of a photoresist by reducing undesirable charge accumulation on the patterned photoresist. The present invention more specifically involves evaluating the patterned photoresist to determine if negative charges exist, and if so, to determine the magnitude of the negative charges, then if appropriate contacting the patterned photoresist with a positive ion carrier which, in turn, effectively reduces the accumulation of negative charges on the patterned photoresist during lithographic processing.

During lithography, a photoresist is provided over a semiconductor substrate. The semiconductor substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The photoresist is provided over at least a portion of the substrate, but typically over the entire substrate.

Any photoresist may be applied to the substrate surface by any suitable means. For example, a 157 nm sensitive photoresist, a 193 nm sensitive photoresist, an I-line, H-line, G-line, E-line, deep UV, extreme UV, X-ray resist, electron beam resist or chemically amplified photoresist material may be spin-coated on the substrate surface. Spin-coating involves depositing the photoresist in a solution over a spinning substrate. The centrifugal forces of the spinning substrate serve to evenly distribute the photoresist over the substrate.

Positive or negative photoresists may be used, but positive photoresists are preferred. Photoresists are commercially available from a number of sources, including Shipley Company, DuPont, Arch Chemical, Aquamer, Hunt, Hoechst Celanese Corporation, Clariant, JSR Microelectronics, and Brewer. The photoresist is typically applied to a thickness from about 200 Å A to about 10,000 Å, although the thickness of the photoresist is not critical to the invention.

Optionally after the photoresist is applied to the substrate surface, the photoresist covered substrate is subjected to a soft bake to drive off excess solvent and/or to increase adhesion with the substrate surface. The soft bake involves heating at an elevated temperature for a suitable period of time.

The photoresist covered substrate is selectively exposed to actinic radiation to cause a chemical transformation in desired regions of the photoresist. The wavelength of radiation is not critical to the invention, as it depends primarily upon the identity of the photoresist material. A mask is typically employed to selectively expose the photoresist.

The selectively exposed photoresist is developed using a suitable developer, such as an aqueous developer. The specific identity of the developer is not critical to the invention, but typically an aqueous alkaline solution is employed. For example, aqueous tetramethylammonium hydroxide is employed as a developer solution. The developer solution is deposited over a spinning photoresist clad substrate. The spinning action serves to uniformly spread the developer over and then off of the photoresist clad substrate.

During development, either the exposed portion of the photoresist (in embodiments where a positive photoresist is employed) or the unexposed portion of the photoresist (in embodiments where a negative photoresist is employed) is soluble or is solubilized in the developing solution. The portion of the photoresist that is not substantially soluble in the developing solution remains on the substrate. The substrate is then optionally rinsed with deionized water. Development results in a patterned photoresist (the remaining portion of the photoresist) over the substrate surface. Due to the lithography processing, and especially the spin cycles, electrostatic charges may accumulate on the patterned photoresist. More particularly, negative electrostatic charges may accumulate on the patterned photoresist.

The patterned photoresist clad substrate is next evaluated to determine if indeed electrostatic charges have accumulated thereon. If it is determined that electrostatic charges have accumulated on the patterned photoresist clad substrate, a determination is made to approximate the magnitude of the accumulated electrostatic charges. Determining whether electrostatic charges exist and their magnitude is accomplished using a measuring device, such as an electrostatic charge sensor having a probe. The electrostatic charge sensor can measure the voltage on the patterned photoresist clad substrate. The measuring device, such as the electrostatic charge sensor, may be coupled to a microprocessor-controller which automatically sets the time, temperature, pressure, and concentration for contacting the positive ion carrier with the patterned photoresist, described below.

Figure 2:
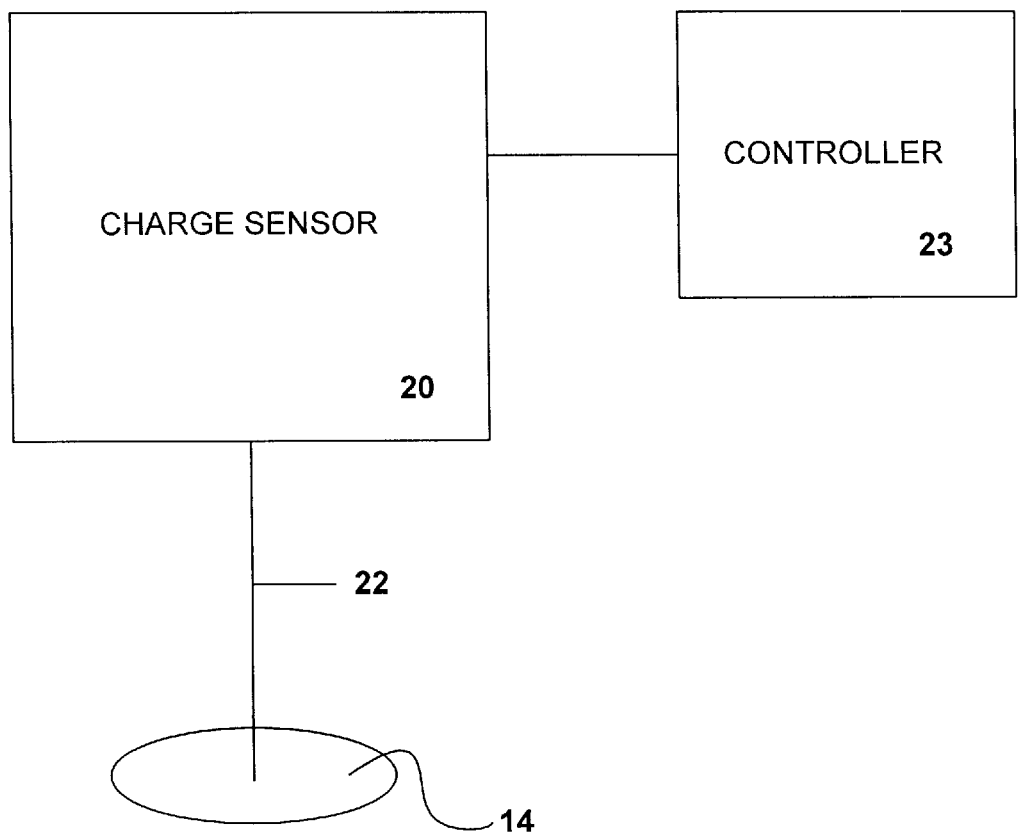
FIG. 2 is a schematic view of developed photoresist detection scheme using a charge sensor in accordance with one aspect of the present invention.

Referring to FIG. 2, a charge sensor 20 having a probe 22 measures the accumulated electrostatic charges, if any, on a patterned photoresist clad substrate 14 (the patterned photoresist is not explicitly shown). The charge sensor 20 is coupled to a controller 23 capable of determining conditions (such as time, temperature, pressure, and concentration) associated with the subsequent contact with a positive ion carrier required to reduce, minimize and/or eliminate the electrostatic charges. If charge sensor 20 does not detect any accumulated electrostatic charges, the patterned photoresist clad substrate 14 may proceed to further semiconductor processing. If, to the contrary, charge sensor 20 detect accumulated electrostatic charges, a positive ion carrier is contacted with the patterned photoresist clad substrate 14, under conditions set by the controller 23.

Next, if it is determined that electrostatic charges have accumulated on the patterned photoresist clad substrate, a positive ion carrier is contacted with the patterned photoresist having negative charges in any suitable manner. The positive ion carrier neutralizes at least a portion of the negative charges thereby providing a patterned photoresist having reduced electrostatic charges. In a preferred embodiment, a sufficient amount of a positive ion carrier is contacted with the patterned photoresist having negative charges to provide a patterned photoresist having no electrostatic charges. The amount of a positive ion carrier is primarily dependent upon the magnitude of the negative charge on the patterned photoresist. Methods of measuring the negative charge on a substrate are known to those skilled in the art.

In one embodiment, the positive ion carrier contacted with the patterned photoresist having negative charges is in the form of an ionized gas or plasma. In another embodiment, the positive ion carrier contacted with the patterned photoresist having negative charges is in the form of an acid solution. In yet another embodiment, the positive ion carrier contacted with the patterned photoresist having negative charges is in the form of a cation containing solution. In still another embodiment, the positive ion carrier contacted with the patterned photoresist having negative charges is in the form of a positive charge containing film.

The positive ion carrier is preferably contacted with the patterned photoresist as soon as possible following contact with the developer. However, time may elapse after development and before contact with the positive ion carrier. For example, the patterned photoresist is contacted by the positive ion carrier within about one hour after development or contact with the developing solution.

The positive ion carrier is contacted with the patterned photoresist for a time, at a temperature, at a pressure, at a concentration sufficient for the positive ion carrier to reduce, minimize and/or eliminate negative charges on the patterned photoresist. The time, temperature, pressure, and concentration are set based upon the magnitude of the accumulated electrostatic charges measured during the evaluation step discussed above. For example, patterned photoresist clad substrates having relatively low charges thereon are contacted with relatively low concentrations of the positive ion carrier, whereas patterned photoresist clad substrates having relatively high charges thereon are contacted with relatively high concentrations of the positive ion carrier.

The positive ion carrier is contacted with the patterned photoresist for a time sufficient for the positive ion carrier to reduce, minimize and/or eliminate negative charges on the patterned photoresist. The time of which the positive ion carrier is contacted with the patterned photoresist is typically from about 1 second to about 1 hour. In another embodiment, the positive ion carrier is contacted with the patterned photoresist for a period of time from about 5 seconds to about 10 minutes. In yet another embodiment, the positive ion carrier is contacted with the patterned photoresist covered substrate surface for a period of time from about 10 seconds to about 1 minute.

In embodiments where the positive ion carrier is an ionized gas or plasma, the plasma contains positive ions. In this connection, the gas that is ionized may contain one or more of nitrogen, argon, helium, neon, krypton, xenon, fluorocarbons, chlorocarbons, chlorofluorocarbons, hydrogen, ammonia, nitrous oxide, phosphine and silane. Preferably, an inert gas, such as one or more of nitrogen, argon, helium, neon, krypton, and xenon, is employed. In one embodiment, the gas flow contains from about 10 sccm to about 10 slm of a gas that forms positive ions. In another embodiment, the gas flow contains from about 25 sccm to about 5 slm of a gas that forms positive ions. In yet another embodiment, the gas flow contains from about 50 sccm to about 1 slm of a gas that forms positive ions.

Any suitable pressure for forming positive ions may be employed when using the plasma. In one embodiment, the pressure in the processing chamber is from about 0.0001 Torr to about 1,000 Torr. In another embodiment, the pressure in the processing chamber is from about 0.001 Torr to about 500 Torr. Any suitable temperature for forming positive ions may be employed when using the plasma. In one embodiment, the temperature in the processing chamber is from about 25° C. to about 1,400° C. In another embodiment, the temperature in the processing chamber is from about 50° C. to about 1,000° C.

In embodiments where the positive ion carrier is an acid solution, the solution contains water and acid. Deionized water is preferred, although tap water may be employed. Acids include Lewis acids, organic acids such as carboxylic acids containing 1 to about 30 and preferably about 2 to about 12 carbon atoms and inorganic acids such as mineral acids.

Specific examples of inorganic acids include nitric acid, halogen acids such as hydrofluoric acid, hydrochloric acid, hydrobromic acid and hydriotic acid, sulfuric acid, sulfurous acid, perchloric acid, boric acid and phosphorous acids such as phosphorous acid and phosphoric acid. Of these inorganic acids, phosphoric acid is preferred.

Organic acids include carboxylic acids and polycarboxylic acids such as alkanoic acids, including formic acid, acetic acid, propionic acid, butyric acid and so on (generally containing 1 to about 10 carbon atoms), dicarboxylic acids, such as oxalic acid, malonic acid, succinic acid and so on (generally containing 1 to about 12 carbon atoms), hydroxyalkanoic acids, such as citric acid (generally containing 1 to about 10 carbon atoms), organic phosphorous acids such as dimethylphosphoric acid and dimethylphosphinic acid, sulfonic acids such as hydrocarbylsulfonic acids (containing 1 to about 20 carbon atoms) including methanesulfonic acid, ethanesulfonic acid, 1-pentanesulfonic acid, 1-hexanesulfonic acid, 1-heptanesulfonic acid, aromatic sulfonic acids such as benzenesulfonic acid, tolulenesulfonic acid, etc. Moreover, in some embodiments, two or more of any of the above-described acids may be used. Preferred organic acids include acetic acid and citric acid.

In one embodiment, the acid solution contains the acid in an amount from about 0.1% to about 25% by weight. In another embodiment, the acid solution contains the acid in an amount from about 0.5% to about 10% by weight. In yet another embodiment, the acid solution contains the acid in an amount from about 1% to about 5% by weight.

In embodiments where the positive ion carrier is a cation containing solution, the solution contains water and a cation containing compound. Deionized water is preferred, although tap water may be employed. The cation containing compound is a compound containing a cation, such as a cationic surfactant or an onium solution. Onium solutions contain an onium cation, such as ammonium cations, phosphonium cations, and sulfonium cations. Ammonium cations, phosphonium cations, and sulfonium cations include quaternary alkyl ammonium cations, quaternary alkyl phosphonium cations, and teriary alkyl sulfonium cations.

Cationic surfactants are known in the art, and many of these surfactants are described in McCutcheon's "Volume I: Emulsifiers and Detergents", 1995, North American Edition, published by McCutcheon's Division MCP Publishing Corp., Glen Rock, N.J., and in particular, pp. 1–232 which describes a number of cationic surfactants and is hereby incorporated by reference for the disclosure in this regard.

In one embodiment, the cation containing solution contains from about 0.1% to about 15% by weight of a cation containing compound. In another embodiment, the cation containing solution contains from about 0.5% to about 10% by weight of a cation containing compound. In yet another embodiment, the cation containing solution contains from about 1% to about 5% by weight of a cation containing compound.

In another embodiment, the cationic surfactant is a fluorocarbon based surfactant. Fluorocarbon based surfactants, such as metal or ammonium fluorocarbon sulfonates or carboxylates, are commercially available from the 3M Company under the trade designation "Fluorad" and from DuPont under the trade designation "Zonyl." Specific Fluorad surfactants include potassium fluorinated alkyl carboxylates, ammonium perfluoro alkyl sulfonates, potassium perfluoro alkyl sulfonates, amine perfluoro alkyl sulfonates, and ammonium perfluoro alkyl carboxylates. Fluorocarbon based surfactants include alkali metal, ammonium and amine fluorinated alkyl sulfonates and carboxylates. Specific Fluorad surfactants include those under the designation FC-93, FC-95, FC-98, FC-99, FC-100, FC-109, FC-120, FC-121, FC-129, FC-135 and FC-143. Specific Zonyl surfactants include those under the designation Zonyl FSA, Zonyl FSE, Zonyl FSJ, Zonyl FSP, Zonyl NF, Zonyl RP, Zonyl TBS and Zonyl UR.

Since many fluorocarbon based surfactants are soluble but not relatively volatile (compared with water), it is preferable although not absolutely necessary to rinse the substrate surface with substantially pure water to ensure that any small amounts of residual fluorocarbon based surfactants are removed.

In another embodiment, the cationic surfactant is an alkyl sulfate (sulfate of an alcohol). The alkyl group of the alkyl sulfate typically contains from about 8 to about 22 carbon atoms. Alkyl sulfate surfactants include ammonium alkyl sulfates such as ammonium lauryl sulfate, ammonium cetyl sulfate, and ammonium stearyl sulfate. Alkyl sulfates are commercially available under the trade designation Rhodapon, and specifically L-22, and under the trade designation Rhodapex, and specifically CD128 and MA360 from Rhone-Poulenc, under the trade designation Duponol from Witco, under the trade designation Stepanol, and specifically AM and AM-V and under the trade designation Polystep, and specifically B-7 and B11 from Stepan Company.

Since many alkyl sulfate surfactants are soluble but not relatively volatile (compared with water), it is preferable although not absolutely necessary to rinse the substrate surface with substantially pure water to ensure that any small amounts of residual alkyl sulfate surfactants are removed.

The temperature of the cation containing solution is typically from about 10° C. to about 50° C. In one embodiment, the temperature of the cation containing solution is from about 15° C. to about 40° C. In another embodiment, the temperature of the cation containing solution is from about 20° C. to about 30° C. The temperature is maintained to maximize the reduction of negative charges present on the developed photoresist, while not substantially damaging or degrading the exposed substrate surface or the developed photoresist.

In an optional embodiment, the patterned photoresist covered substrate is heated to drive off any remaining water and/or surfactant after contact with the cation containing solution. Heating or post-rinse baking is conducted at temperatures above about 50° C. for at least about 10 seconds.

In embodiments where the positive ion carrier is a positive charge containing film, the film contains compounds with at least a partial positive charge. Typically, compounds with at least a partial positive charge have the positive charge at one end of the molecule and an organic portion at the other end of the molecule. In this connection, the positive charge containing film may be similar in orientation to a lipid in that a series of molecules are similarly positioned so that the ends having positive charges are aligned. Such orientations include micelle structures wherein positively charged heads (the end having a positive charge) form the outer surface of the micelle and the organic portions are directed inwards, layered structures wherein rows of molecules have positively charged heads facing the same direction, and bilayer structures wherein two rows of molecules having positively charged heads facing the same direction are adjacent and facing opposite directions. A general example of a molecule having a positive charge at one end and an organic portion at the other end is an ammonium compound containing at least one organic group, such as an alkyl chain (the nitrogen atom constituting the positively charged head and the alkyl group constituting the organic portion).

Figure 3:
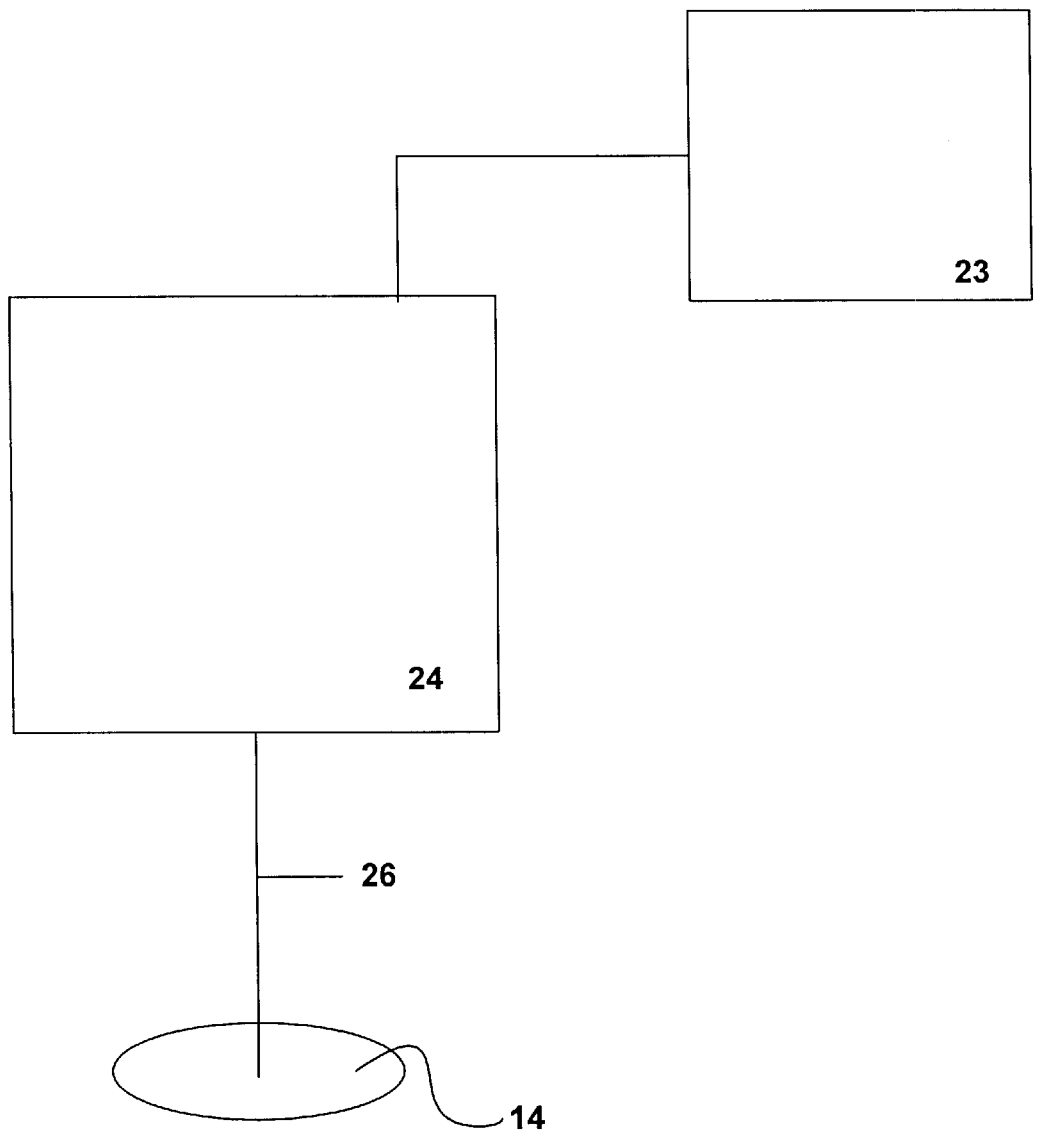
FIG. 3 is a schematic view of contacting a patterned photoresist with a positive ion carrier in accordance with one aspect of the present invention.

Referring to FIG. 3, in embodiments where the positive ion carrier is an acid solution, a cation containing solution, or a positive charge containing film, the positive ion carrier is deposited on the a patterned photoresist clad substrate 14 having electrostatic charges thereon (the patterned photoresist is not explicitly shown) from a liquid dispenser 24 via a nozzle 26. The liquid dispenser 24 is coupled to a controller 23 capable of determining conditions (such as time, temperature, and concentration) associated with the deposition of the positive ion carrier in order to reduce, minimize and/or eliminate the electrostatic charges. In one aspect of the present invention, the controller 23 is also coupled to the charge sensor 20 of FIG. 2.

Figure 4:
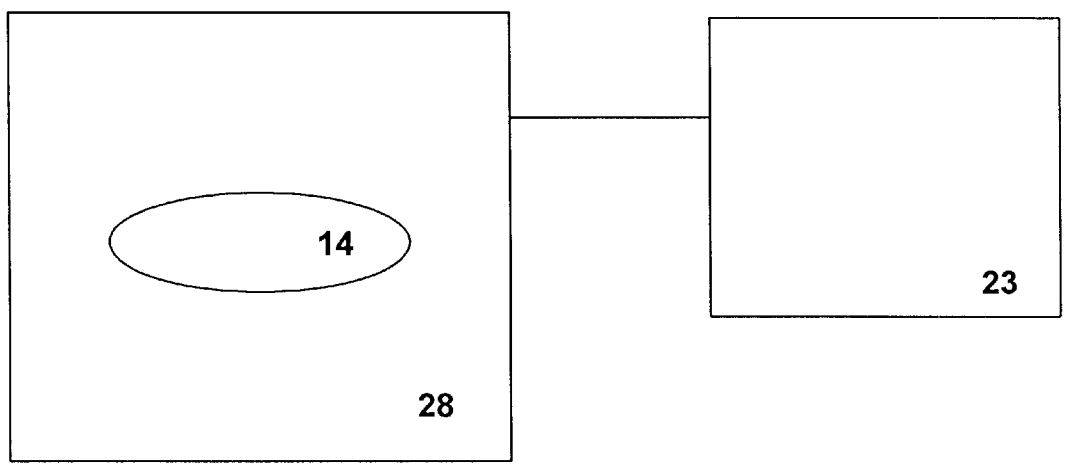
FIG. 4 is a schematic view of contacting a patterned photoresist with a positive ion carrier in accordance with another aspect of the present invention.

Referring to FIG. 4, in embodiments where the positive ion carrier is an ionized gas or plasma, the positive ion carrier is contacted with the a patterned photoresist clad substrate 14 having electrostatic charges thereon (the patterned photoresist is not explicitly shown) in an ionization/plasma chamber 28. The ionization/plasma chamber 28 is coupled to a controller 23 capable of determining conditions (such as time, temperature, pressure, and concentration) associated with the positive ion carrier in order to reduce, minimize and/or eliminate the electrostatic charges. In one aspect of the present invention, the controller 23 is also coupled to the charge sensor 20 of FIG. 2.

Comparing a developed photoresist before and after contact with the positive ion carrier, the developed photoresist after contact has at least about 50% less negative charge (for example, in volts) than the developed photoresist before contact. In another embodiment, the developed photoresist after contact has at least about 75% less negative charge than the developed photoresist before contact. In yet another embodiment, the developed photoresist after contact has at least about 90% less negative charge than the developed photoresist before contact. In still yet another embodiment, the developed photoresist after contact has no detectable negative charge.

After the positive ion carrier contacts the developed photoresist surface, accumulated negative charges are reduced, minimized and/or eliminated. As a result, subsequent processing of the substrate is facilitated. Especially when evaluating the developed photoresist with an electron beam, such as from an SEM or AFM, processing is enhanced. For example, referring to FIG. 2, subsequent processing involving inspection/measurement is shown, wherein like elements are represented with like numerals in relation to FIG. 1.

Figure 5:
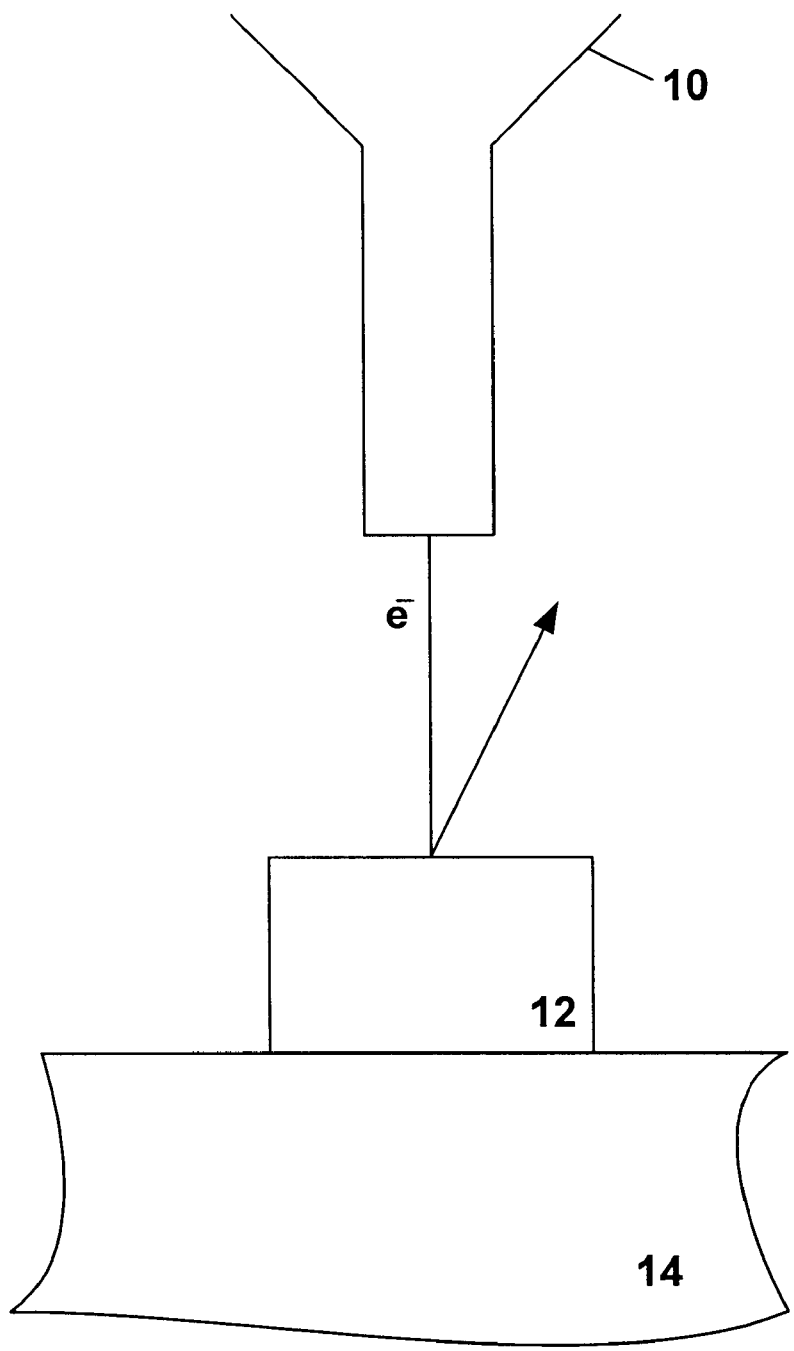
FIG. 5 is a view of a developed photoresist detection scheme using an SEM in accordance with one aspect of the present invention.

In FIG. 5, SEM 10 emits an electron beam (represented by the arrow) towards a developed photoresist structure 12 on semiconductor substrate 14. The electron beam reflects off of the developed photoresist structure 12 and is detected by a detector (not shown) of the SEM. Since the negative charges that may have accumulated on the developed photoresist 12 surface are eliminated by the present invention, the electron beam from SEM 10 is not repulsed or deflected but instead detected after reflecting off of the developed photoresist 12. Consequently, an accurate measurement of the linewidth, sharp corner definition, focussed structural details and/or accurate profile data (or other evaluation data) of the developed photoresist 12 may be obtained. Assessment of the quality and parameters of a lithography process is consequently improved by the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a photoresist on a semiconductor structure, comprising:
    exposing and developing the photoresist;
    evaluating the exposed and developed photoresist to determine if negative charges exist thereon;
    contacting the exposed and developed photoresist with a positive ion carrier thereby reducing any negative charges thereon, wherein the positive ion carrier comprises an ionized gas, an acid solution, a cation containing solution, a positive charge containing film, or a cationic surfactant; and
    evaluating the exposed and developed photoresist with an electron beam.

2. The method of claim 1, wherein the positive ion carrier comprises an ionized gas.

3. The method of claim 1, wherein the positive ion carrier comprises an acid solution.

4. The method of claim 1, wherein the positive ion carrier comprises a cation containing solution.

5. The method of claim 1, wherein the positive ion carrier comprises a positive charge containing film.

6. The method of claim 1, wherein the positive ion carrier comprises a cationic surfactant.

7. The method of claim 1, wherein evaluating involves at least one of making a linewidth measurement, generating profile data, determining corner sharpness, determining critical dimension control, and making an image inspection.

8. The method of claim 1, wherein the electron beam is generated from a scanning electron microscope or an atomic force microscope.

9. A method of reducing electrostatic charges on a developed photoresist to improve evaluation of the photoresist, comprising:
    contacting the developed photoresist with a positive ion carrier thereby reducing the electrostatic charges thereon by at least about 50%, wherein the positive ion carrier comprises an ionized gas, an acid solution, an onium solution, or a positive charge containing film; and
    evaluating the developed photoresist with one of a scanning electron microscope and an atomic force microscope.

10. The method of claim 9, wherein the ionized gas comprises at least one of nitrogen, argon, helium, neon, krypton, xenon, fluorocarbons, chlorocarbons, chlorofluorcarbons, hydrogen, ammonia, nitrous oxide, phosphine and silane.

11. The method of claim 9, wherein the acid solution comprises at least one of nitric acid, hydrofluoric acid, hydrochloric acid, hydrobromic acid, hydriotic acid, sulfuric acid, sulfurous acid, perchloric acid, boric acid, phosphorous acid, phosphoric acid, formic acid, acetic acid, propionic acid, butyric acid oxalic acid, malonic acid, succinic acid, citric acid, dimethylphosphoric acid, dimethylphosphinic acid, methanesulfonic acid, ethanesulfonic acid, 1-pentanesulfonic acid, 1-hexanesulfonic acid, 1-heptanesulfonic acid, benzenesulfonic acid, and tolulenesulfonic acid.

12. The method of claim 9, wherein the acid solution comprises from about 0.1% to about 25% by weight of an acid.

13. The method of claim 9, wherein the onium solution comprises from about 0.1% to about 15% by weight of an onium compound, and the onium solution comprises at least one of an ammonium cation, a phosphonium cation, and a sulfonium cation.

14. The method of claim 9, wherein the developed photoresist is evaluated with the scanning electron microscope.

15. The method of claim 9, wherein the positive ion carrier reduces the electrostatic charges on the photoresist by at least about 90%.

16. A system for processing a patterned photoresist on a semiconductor structure, comprising:
    a charge sensor for determining if charges exist on the patterned photoresist and measuring the charges;

a means for contacting the patterned photoresist with a positive ion carrier to reduce the charges thereon;

a controller for setting at least one of time of contact between the patterned photoresist and the positive ion carrier, temperature of the positive ion carrier, concentration of positive ions in the positive ion carrier, and pressure under which contact between the patterned photoresist and the positive ion carrier occurs; and a device for evaluating the patterned photoresist with an electron beam.

17. The system of claim 16, wherein the charge sensor is an electrostatic charge sensor.

18. The system of claim 16, wherein the means for contacting the patterned photoresist with a positive ion carrier is a plasma/ionization chamber.

19. The system of claim 16, wherein the means for contacting the patterned photoresist with a positive ion carrier is a spin-on deposition apparatus.

20. The system of claim 16, wherein the controller sets at least one of time of contact between the patterned photoresist and the positive ion carrier and concentration of positive ions in the positive ion carrier.

21. The system of claim 16, wherein the controller is coupled to the charge sensor and the means for contacting the patterned photoresist with a positive ion carrier.

22. The system of claim 16, wherein the device for evaluating the patterned photoresist with an electron beam is one of a scanning electron microscope and an atomic force microscope.

23. A system for reducing electrostatic charges on a developed photoresist to improve evaluation of the photoresist, comprising:

an electrostatic charge sensor for determining if charges exist on the developed photoresist and measuring the charges;

a means for contacting the developed photoresist with a positive ion carrier to reduce the charges thereon;

a microprocessor-controller, coupled to the electrostatic charge sensor and the means for contacting the developed photoresist with a positive ion carrier, for setting at least one of time of contact between the developed photoresist and the positive ion carrier and concentration of positive ions in the positive ion carrier; and a scanning electron microscope for evaluating the developed photoresist with an electron beam.

* * * * *